US012265305B2

(12) United States Patent
Melakari

(10) Patent No.: US 12,265,305 B2
(45) Date of Patent: Apr. 1, 2025

(54) SUBTRACTIVE METHOD FOR PROVIDING CONNECTIONS TO ELECTRODES IN LIQUID CRYSTAL CELLS

(71) Applicant: Pixieray Oy, Espoo (FI)

(72) Inventor: Klaus Melakari, Espoo (FI)

(73) Assignee: Pixieray Oy, Espoo (FI)

( * ) Notice: Subject to any disclaimer, the term of this patent is extended or adjusted under 35 U.S.C. 154(b) by 30 days.

(21) Appl. No.: 18/327,164

(22) Filed: Jun. 1, 2023

(65) Prior Publication Data
US 2024/0402546 A1 Dec. 5, 2024

(51) Int. Cl.
*G02F 1/1345* (2006.01)
*B23K 26/362* (2014.01)
(Continued)

(52) U.S. Cl.
CPC ........ *G02F 1/13452* (2013.01); *B23K 26/362* (2013.01); *G02F 1/133351* (2013.01);
(Continued)

(58) Field of Classification Search
CPC ........... G02F 1/13452; G02F 1/133354; G02F 1/133351; G02F 1/134309; G02F 1/1347; G02F 2202/28; G02F 1/13454; G02F 1/13456; G02F 1/13458; G02F 1/133365; G02F 1/0311; G02F 1/0316; G02F 1/136286; G02F 1/1339; G02F 1/133345; G02F 1/1368; G02F 1/136209; G02F 1/1345; G02F 1/1337; G02F 1/13398; G02F 1/13396; G02F 1/13394; B23K 26/362;
(Continued)

(56) References Cited

U.S. PATENT DOCUMENTS

2002/0033911 A1 3/2002 Ishida et al.
2002/0110944 A1 8/2002 Kian et al.
(Continued)

FOREIGN PATENT DOCUMENTS

CN 1918538 A * 2/2007 ........... G06F 3/0416
CN 101680973 A * 3/2010 ........... G02B 5/0226
(Continued)

OTHER PUBLICATIONS

European Patent Office, Extended European Search Report, Application No. 24176300.2, mailed Dec. 16, 2024, 9 pages.

*Primary Examiner* — Hoan C Nguyen
(74) *Attorney, Agent, or Firm* — Ziegler IP Law Group, LLC.

(57) ABSTRACT

A method for manufacturing an optical device includes forming a first layer of a first electrode material on a surface of a first substrate of the optical device; disposing electrically-conductive adhesive material on region(s) of the first layer corresponding to the first region of the surface of the first substrate; ablating disposed ECA material from portion(s) of the first region, ablating the formed first layer of first electrode material to create a first electrode; forming a second layer of a second electrode material on the surface of the second substrate of the optical device; ablating the formed second layer of second electrode material to create a second electrode; and forming a third layer of active material(s) between the first substrate and the second substrate.

22 Claims, 8 Drawing Sheets

(51) Int. Cl.
  *G02F 1/1333* (2006.01)
  *G02F 1/1343* (2006.01)
  *G02F 1/1347* (2006.01)

(52) U.S. Cl.
  CPC .. *G02F 1/133354* (2021.01); *G02F 1/134309* (2013.01); *G02F 1/1347* (2013.01); *G02F 2202/28* (2013.01)

(58) Field of Classification Search
  CPC .... B23K 26/364; B23K 26/38; B23K 26/382; B23K 28/00; H01L 24/03; H01L 23/482; H01L 24/83; H01L 24/05; H01L 24/32; B24B 9/065; H10K 59/131
  See application file for complete search history.

(56) References Cited

U.S. PATENT DOCUMENTS

| | | |
|---|---|---|
| 2004/0001915 A1 | 1/2004 | He et al. |
| 2007/0183293 A1* | 8/2007 | Murata ............... G11B 7/13925 369/112.02 |
| 2010/0097551 A1 | 4/2010 | Yamagishi et al. |
| 2017/0255047 A1 | 9/2017 | Galstian et al. |
| 2019/0243199 A1* | 8/2019 | Bae ...................... G02F 1/13458 |
| 2020/0004093 A1* | 1/2020 | Yoo ........................ H01L 24/03 |
| 2020/0264468 A1* | 8/2020 | Park .................... G02F 1/13452 |
| 2020/0298342 A1 | 9/2020 | Martinez et al. |
| 2022/0050318 A1* | 2/2022 | Lin ....................... G02F 1/1337 |

FOREIGN PATENT DOCUMENTS

| | | | |
|---|---|---|---|
| JP | 2000214424 A | * | 8/2000 |
| JP | 2010026206 A | * | 2/2010 |
| WO | WO-9104123 A1 | * | 4/1991 |

* cited by examiner

SUBTRACTIVE METHOD FOR PROVIDING CONNECTIONS TO ELECTRODES IN LIQUID CRYSTAL CELLS

TECHNICAL FIELD

The present disclosure relates to methods for manufacturing optical devices. The present disclosure also relates to methods for assembling a plurality of optical devices.

BACKGROUND

Nowadays, adaptive lenses which can change a focal length or a shape in response to variations of electric field, magnetic field, light intensity, or similar, are increasingly being manufactured. Unlike conventional lenses, properties of the adaptive lenses can be adjusted to provide a variable focus or manipulate a direction of light. Typically, an adaptive lens comprises at least two electrodes. Herein, an optical power of the adaptive lens are adjusted by controlling a voltage or a current supplied to the at least two electrodes. Traditionally, a given electrode is connected in-plane using an anisotropic conductive film to bond a surface of the given electrode to a flexible printed circuit. However, to work with non-polarised light and/or reach a high optical power a plurality of adaptive lenses (each having at least two electrodes) are stacked together. Such stacking of the adaptive lenses yields inept integration.

Typically, electrically-conductive adhesive materials are used to provide electrical connections to multiple adaptive lenses that are stacked together, wherein the electrically-conductive adhesive material is dispensed either in a form of a dot or a plurality of lines on respective electrodes of the multiple adaptive lenses. When the electrically-conductive adhesive material is dispensed in a form of a dot on a given electrode, it is difficult to precisely position connection areas only where the given electrode is present. When the electrically-conductive adhesive material is dispensed in a form of a line on a given electrode, there may be discontinuity in such a line, thereby leading to a discontinuous electrical connection to the given electrode. Hence, dispensing the electrically-conductive adhesive material in both the form of the dot and the plurality of lines is undesirable, and often leads to a defective integration of such adaptive lenses with other electrical components.

Referring to FIG. 1 (that represents Prior Art), illustrated is a cross-section view of an optical device 100 comprising an assembly of a plurality of adaptive lenses 102A, 102B, 102C, and 102D, wherein the plurality of adaptive lenses 102A-D are stacked together. With reference to FIG. 1, each adaptive lens from amongst the plurality of adaptive lenses 102A-D comprises a first substrate 104, a first electrode 106 formed on the first substrate 104, a second substrate 108, a second electrode 110 formed on the second substrate 108, and an active material 112 encased between the first electrode 106 and the second electrode 110. As shown, there is a gap 114 between the first electrode 106 and the second electrode 110. The stacked plurality of adaptive lenses 102A-D are bonded using an optically-clear adhesive 116, wherein the optically-clear adhesive 116 enables passage of light incident on the plurality of adaptive lenses 102A-D.

With reference to FIG. 1, the gap 114 is partially filled with electrically-conductive adhesive material 118 that is deposited on the second electrode 110, in a form of a bead. The assembly of the plurality of adaptive lenses 102A-D is cut, for example, along a dashed line to expose the electrically-conductive adhesive material 118. However, as noted above, accurate dispensing of the electrically-conductive adhesive material 118 in the form of bead is difficult as the deposition needs precise positioning of conductive areas based on the location of the second electrode 110.

Therefore, in light of the foregoing discussion, there exists a need to overcome the aforementioned drawbacks associated with the existing techniques and equipment for providing electrical connections to adaptive lenses.

SUMMARY

The present disclosure seeks to provide a method for manufacturing an optical device. The present disclosure also seeks to provide a method for assembling a plurality of optical devices. In some implementations, the aim of the present disclosure is achieved by a subtractive method that involves first forming a layer of an electrode material and disposing an electrically-conductive adhesive material, and then ablating the formed layer of the electrode material and the disposed electrically-conductive adhesive material, as defined in some of the appended independent claims to which reference is made to. In other implementations, the aim of the present disclosure is achieved by another subtractive method that involves forming a layer of an electrode material using welding, and then ablating the formed layer of the electrode material, as defined in another of the appended independent claims to which reference is made to. Advantageous features are set out in the appended dependent claims.

Embodiments of the present disclosure substantially eliminate or at least partially address the aforementioned problems in the prior art, and enable manufacturing of optical devices in an efficient, simple and a reliable manner such that the electrically-conductive adhesive material, the first electrode and the second electrode are formed in a precise manner with respect to each other, thereby facilitating continuous and reliable electrical connectivity.

Throughout the description and claims of this specification, the words "comprise", "include", "have", and "contain" and variations of these words, for example "comprising" and "comprises", mean "including but not limited to", and do not exclude other components, items, integers or steps not explicitly disclosed also to be present. Moreover, the singular encompasses the plural unless the context otherwise requires. In particular, where the indefinite article is used, the specification is to be understood as contemplating plurality as well as singularity, unless the context requires otherwise.

BRIEF DESCRIPTION OF THE DRAWINGS

FIG. 4A illustrates a front cross-section view of an optical device, whereas

DETAILED DESCRIPTION OF EMBODIMENTS

Figure 1:
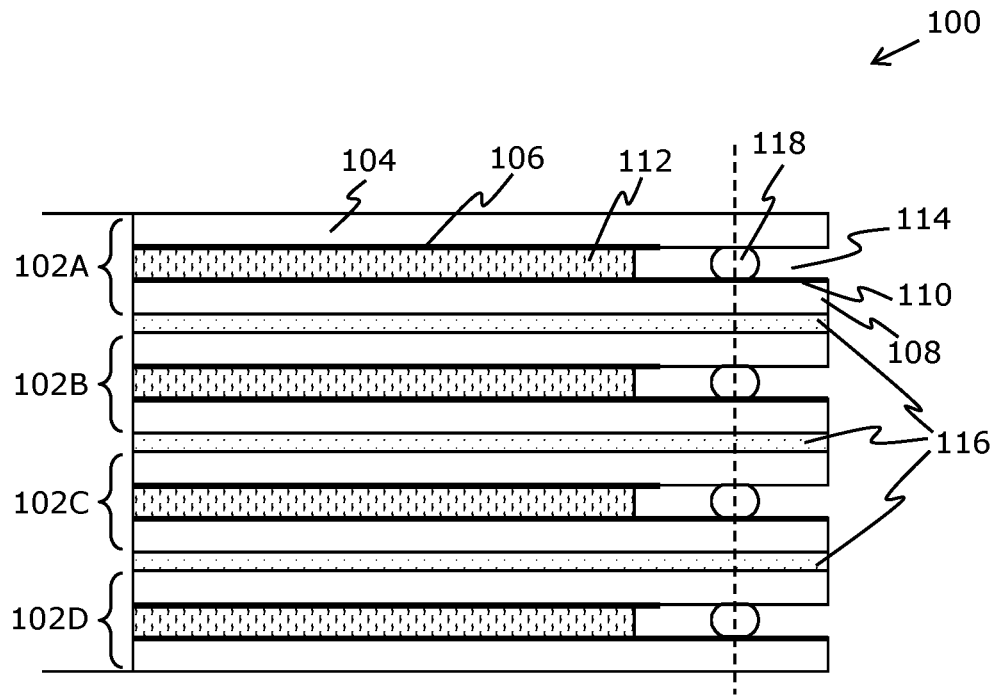
FIG. 1 (Prior Art) illustrates a cross-section view of an optical device comprising an assembly of a plurality of adaptive lenses.

The following detailed description illustrates embodiments of the present disclosure and ways in which they can be implemented. Although some modes of carrying out the present disclosure have been disclosed, those skilled in the art would recognize that other embodiments for carrying out or practising the present disclosure are also possible.

In a first aspect, an embodiment of the present disclosure provides a method for manufacturing an optical device, the method comprising:
- forming a first layer of a first electrode material on a surface of a first substrate of the optical device;
- disposing an electrically-conductive adhesive material on at least a region of the first layer corresponding to a first region of the surface of the first substrate;
- ablating the disposed electrically-conductive adhesive material from at least one portion of the first region, whilst ablating the formed first layer of the first electrode material to create a first electrode;
- forming a second layer of a second electrode material on a surface of a second substrate of the optical device;
- ablating the formed second layer of the second electrode material to create a second electrode; and
- forming a third layer of at least one active material between the first substrate and the second substrate, wherein the first electrode is disposed between the first substrate and said third layer of the at least one active material, and the second electrode is disposed between the second substrate and said third layer of the at least one active material.

In a second aspect, an embodiment of the present disclosure provides a method for assembling a plurality of optical devices, the method comprising:
- manufacturing a plurality of optical devices, wherein each of the plurality of optical devices is manufactured using the method of the aforementioned first aspect;
- cutting the plurality of optical devices through respective first regions on first substrates of the plurality of optical devices; and
- stacking the plurality of optical devices together, whilst aligning the respective first regions together.

The present disclosure provides the aforementioned method for manufacturing an optical device and the aforementioned method for assembling a plurality of optical devices. Pursuant to embodiments of the present disclosure, the electrically-conductive adhesive material is disposed separately on the region of the first layer corresponding to the first region, and then ablated from the at least one portion of the first region, instead of dispensing the electrically-conductive adhesive material in a form of a bead or a plurality of lines. This overcomes requirements and challenges of dispensing the electrically-conductive adhesive material in the prior art. This also allows to ablate the disposed electrically-conductive adhesive material from the at least one portion of the first region in a precise manner, thereby rendering said portions non-conductive. Consequently, a remaining portion of the electrically-conductive adhesive material, which is left unablated (namely, after ablation) in a remaining portion of the region of the first layer, is also formed accurately and with precision. Moreover, simultaneous ablation of the first electrode material with the ablation of the electrically-conductive adhesive material allows for creating the first electrode without a need for an extra manufacturing step.

In a third aspect, an embodiment of the present disclosure provides method for manufacturing an optical device, the method comprising:
- forming a first layer of a first electrode material on a surface of a first substrate of the optical device, using welding;
- ablating the formed first layer of the first electrode material to create a first electrode;
- forming a second layer of a second electrode material on a surface of a second substrate of the optical device;
- ablating the formed second layer of the second electrode material to create a second electrode; and
- forming a third layer of at least one active material between the first substrate and the second substrate, wherein the first electrode is disposed between the first substrate and said third layer of the at least one active material, and the second electrode is disposed between the second substrate and said third layer of the at least one active material.

Pursuant to the aforementioned third aspect, the first electrode is formed by welding the first electrode material directly onto the surface of the first substrate and ablating the first layer of the first electrode material. The first layer formed due to said welding is thick enough to enable drawing electrical connections therefrom; therefore, no additional electrically-conductive adhesive material is required to be disposed. This overcomes the requirements and the challenges of dispensing the electrically-conductive adhesive material in the prior art, whilst reducing a need for an extra manufacturing step.

The optical device can easily be implemented in various types of optical apparatuses, for example, such as, a pair of sunglasses, smart glasses, display panels, display devices, and similar. Moreover, the method for manufacturing the optical device and the method for assembling the plurality of optical devices can be implemented with ease. In some implementations, the assembly of the plurality of optical devices enables provision of a high optical power. In other implementations, the assembly of the plurality of optical devices enables provision of a three-dimensional volumetric display. Furthermore, such assembly of the plurality of the optical provides devices simplified electrical connections. Advantageously, a vast variety of usage scenarios are feasible with such assembling of the plurality of optical devices.

Throughout the present disclosure, the term "optical device" refers to a device that creates electromagnetic radiation or a device that manipulates electromagnetic radiation. The phrase "creates electromagnetic radiation" refers to a process of generating electromagnetic radiation. Examples of such an optical device that creates electromagnetic radiation include, but are not limited to, a liquid crystal display panel, a liquid crystal on silicon (LCOS) display panel, an organic light-emitting diode display panel, an electrophoretic display panel.

The phrase "manipulates electromagnetic radiation" refers to controlling of properties of the electromagnetic radiation. Herein, the properties of the electromagnetic radiation may include at least one of: a wavelength, a frequency, an amplitude, a polarization, a direction of propagation. The optical device can manipulate electromagnetic radiation by at least one of: refracting, reflecting, absorbing, transmitting, interfering, the electromagnetic radiation. Examples of such an optical device that manipulates electromagnetic radiation include, but are not limited to, a liquid crystal lens, an electro-wetting lens, an index-matching lens, a tunable optical filter. Such an optical device may, for example, be utilised in various optical apparatuses, for example, such as adaptive eyeglasses.

Throughout the present disclosure, the term "electrode material" refers to a substance that is used to make an electrode. A given electrode material (namely, the first electrode material and/or the second electrode material) can be optically transparent or optically opaque, depending on a specific application of the optical device. The optical transparency of the given electrode material enables passage of light therethrough, while the optical opaqueness of the given electrode material enables absorption, scatter, or reflection of light. Examples of an optically transparent electrode material may include, but are not limited to, indium tin oxide (ITO), doped zinc oxide (ZnO; ZnO being doped with aluminium or hydrogen), a conductive polymer, and graphene. Examples of an optically opaque electrode material include, but are not limited, metals (for example, such as copper, aluminium, gold, platinum, nickel or similar) and metal alloys.

Throughout the present disclosure, the term "substrate" refers to a base upon which a given layer of a given electrode material is deposited. The given substrate also provides support to the given layer of the given electrode material. Herein, the given substrate encompasses the first substrate and the second substrate. Likewise, the given layer encompasses the first layer and the second layer. Similarly, the given electrode material encompasses the first electrode material and the second electrode material. Moreover, the given substrate can be made of any one of: a glass, a plastic, a polycarbonate, a high-index plastic, a flexible membrane.

The first layer of the first electrode material can be formed on the first substrate using deposition techniques that are well-known in the art. Examples of such deposition techniques may include, but are not limited to, a sputtering technique, an evaporation technique, and a chemical vapor deposition technique. Herein, the first layer can be formed as a thin layer on the surface of the first substrate. A technical effect of forming the thin layer on the surface of the first substrate is that conductivity of the first electrode material is improved as electrical resistance reduces. Furthermore, an amount of light reflected from the first electrode material is reduced to improve a contrast and readability when the optical device is implemented for display purposes.

The second electrode material may be same as or different from the first electrode material. The deposition techniques used for forming the second layer of the second electrode material on the second substrate can be same as or different from the deposition techniques used for forming the first layer of the first electrode material on the first substrate. The second layer can be formed as a thin layer on the surface of the second substrate, wherein a dimension of the thin layer of the second electrode material formed on the second substrate may be same as or different from a dimension of the thin layer of the first electrode material formed on the first substrate.

Throughout the present disclosure, the term "electrically-conductive adhesive material" refers to a material having adhesive properties as well as electrical conductivity properties. The electrically-conductive adhesive material is used to bond the first electrode material with other components (for example, such as electronic components), whilst providing an electrical connection between the first electrode material and the other components.

Optionally, in this regard, the electrically-conductive adhesive material comprises a polymer matrix that comprises conductive particles. Herein, the conductive particles provide electrical conductivity, while the polymer matrix provides adhesive properties. Advantageously, the electrically-conductive adhesive material is used to provide a uniform and reliable electrical connection of the first electrode to the other components. Examples of the electrically-conductive adhesive material may include, but are not limited to, an electrically-conductive epoxy adhesive, an electrically-conductive silicone adhesive, an electrically-conductive acrylic adhesive, and an electrically-conductive polyurethane adhesive.

As the electrically-conductive adhesive material is disposed on top of the first electrode material and ablated whilst creating the first electrode, the remaining portion of the electrically-conductive adhesive material (that is left unablated after ablation) conforms to a shape of the first electrode. Herein, the electrically-conductive adhesive material can be disposed by using a dispenser (for example, a dispensing tube) or an application technique. Such dispensers and application techniques are well-known in the art.

Optionally, the first region of the surface of the first substrate (at which the electrically-conductive adhesive material is disposed) lies in a proximity of an edge of the first layer of the first electrode material. This reduces wastage when the optical device is cut through the first region to enable drawing electrical connections from the first electrode. This also helps in a precise alignment of the first substrate, to facilitate edge connectivity in a simple manner.

Throughout the present disclosure, the term "ablation" refers to a process of removal of a substance. In the aforementioned first aspect and the aforementioned second aspect, the electrically-conductive adhesive material and the first electrode material are selectively removed from the surface of the first substrate to create the first electrode, and the second electrode material is selectively removed from the surface of the second substrate to create the second electrode. In the aforementioned third aspect, the first electrode material and the second electrode material are selectively removed from the surfaces of the first substrate and the second substrate to create the first electrode and the second electrode, respectively. Optionally, ablating the disposed electrically-conductive adhesive material from the at least one portion of the first region produces separate segments of the disposed electrically-conductive adhesive material on a remaining portion of the first region. Simultaneously, the first layer of the first electrode material corresponding to the at least one portion of the first region is ablated in a manner similar to the ablation of the electrically-conductive adhesive material from the at least one portion of the first region. Hence, the remaining portion of the first region is left with the separate segments of the electrically-conductive adhesive material as well as the first electrode material.

Optionally, the step of ablating is performed using laser ablation. In this regard, a high-intensity laser beam is focused on the at least one portion of the first region and the formed second layer of the second electrode material, causing the electrically-conductive adhesive material and the first electrode material on the at least one portion of the first region, and the formed second layer of the second electrode material to heat up rapidly and consequently vaporize or melt away. Similarly, the high-intensity laser beam can be utilised to ablate the first layer of the first electrode material to create the first electrode in any desired shape. Similarly, the high-intensity laser beam can be utilised to ablate the second layer of the second electrode material to create the second electrode in any desired shape. A technical effect of performing the step of ablation using laser ablation is that the electrically-conductive adhesive material disposed on at least the first region, the first electrode material, and the second electrode material are removed without generating excessive heat and mechanical stress, thereby causing no damage to the first electrode and the second electrode so formed. Furthermore, the laser ablation can be used to create precise cuts, holes, or other features in the electrically-conductive adhesive material disposed on the first region, the first electrode material, and the second electrode material.

Alternatively, optionally, the step of ablating is performed using etching. Herein, the term "etching" refers to removal of the electrically-conductive adhesive material from the first region, and the given electrode material from the given substrate by means of physical etching or chemical etching. Herein, the physical etching (commonly known as dry etching) involves removal of the electrically-conductive adhesive material from the first region and the given electrode material by physically bombarding with ions or atoms. This can be used to create the first electrode and the second electrode with high aspect ratios, namely to create the first electrode by precise selective-removal of electrically-conductive adhesive material from the first region and of the first electrode material from the surface of the first substrate, and to create the second electrode by precise selective-removal of the second electrode material from the surface of the second substrate. On the other hand, the chemical etching involves removal of the electrically-conductive adhesive material disposed on the first region, the first electrode material, and the second electrode material using a chemical solution to dissolve or etch the electrically-conductive adhesive material disposed on the first region, the first electrode material from the first substrate, and the second electrode material from the second substrate.

Throughout the present disclosure, the term "active material" refers to a material that can be actively controlled to create or manipulate electromagnetic radiation. Examples of the active material include, but are not limited to, a liquid crystal material, organic polymers, organic molecules, and a combination of an electrically-conducting liquid and an electrically-insulating liquid. In this regard, the phrase "at least one" in the term "at least one active material" means that a combination of one or more active materials can be used to form the third layer between the first substrate and the second substrate. As an example, when the optical device is a liquid crystal cell, the at least one active material comprises a liquid crystal material. As another example, when the optical device is an organic light-emitting diode display panel, the at least one active material comprises organic molecules or polymers.

Optionally, the method further comprises:
cutting the optical device through the first region on the first substrate; and
electrically connecting the electrically-conductive adhesive material in a remaining portion of the region of the first layer corresponding to the first region with a driving circuit of the optical device, to provide an electrical connection between the first electrode and the driving circuit.

In this regard, the cutting of the optical device through the first region exposes the electrically-conductive adhesive material, thereby enabling integration with other components or devices. Optionally, the cutting is performed in a transversal manner, wherein the cut exposes the separate segments of the electrically-conductive adhesive material on the first region. Optionally, the cutting is performed perpendicular to the first layer of the first electrode material and the disposed electrically-conductive adhesive material. Alternatively, optionally, the cutting is performed obliquely to the first layer of the first electrode material; in such a case, a larger surface area of the electrically-conductive adhesive material is exposed, as compared to when the cutting is performed perpendicularly.

Herein, the term "driving circuit" refers to an electronic circuit that is responsible for controlling various aspects of the operation of the optical device. As an example, a voltage of the first electrode and the second electrode can be controlled, to produce a given optical power at the optical device. The driving circuit could include various electronic components, for example, such as transistors, resistors, capacitors, and/or integrated circuits. Herein, the electronic components are arranged in a specific configuration to achieve a functionality of the driving circuit, depending on a purpose of the optical device.

When the electrically-conductive adhesive material in the remaining portion of the first region is electrically connected with the driving circuit of the optical device, a conductive pathway is created between the first electrode and the driving circuit, thereby allowing a flow of electrical signals (i.e., voltage or current) between them. Hence, the driving circuit is able to control the operation of the optical device by sending signals through the conductive pathways to the first electrode.

Optionally, the electrically-conductive adhesive material is also disposed on a second region of the surface of the first substrate during the step of disposing, wherein the second region of the surface of the first substrate is free from the first electrode material,
wherein the disposed electrically-conductive adhesive material is also ablated from at least one portion of the second region during the step of ablating,
the method further comprising:
aligning the first substrate and the second substrate together, prior to or during the step of forming the third layer of at least one active material, to make contact between the second electrode and the electrically-conductive adhesive material in a remaining portion of the second region, wherein the optical device is also cut through the second region during the step of cutting; and
electrically connecting the electrically-conductive adhesive material in the remaining portion of the second region with the driving circuit of the optical device, to provide an electrical connection between the second electrode and the driving circuit.

A technical effect of keeping the second region of the surface of the first substrate free from the first electrode material is that no direct connection is formed between the first electrode and the second electrode when the first substrate and the second substrate are aligned, thereby reducing a risk of getting short-circuited. A technical effect of disposing the electrically-conductive adhesive material also on the second region during the step of disposing is that it utilizes the processing resources in a time-efficient manner, as the electrically-conductive adhesive material is disposed on the first region and on the second region in one go.

It will be appreciated that a dimension of the second region can be same as or different from a dimension of the first region. A location of the second region is such that the electrically-conductive adhesive material disposed on the second region of the surface of the first substrate does not come in contact with the first layer of the first electrode material.

Optionally, the second region of the surface of the first substrate (on which the electrically-conductive adhesive material is disposed) lies in a proximity of an edge of the second layer of the second electrode material. This reduces wastage when the optical device is cut through the second region to draw electrical connections. This also helps in a precise alignment of the second substrates of the plurality of optical devices, to facilitate edge connectivity in a simple manner. In this regard, the first substrate and the second substrate are aligned together in an overlapping manner. The second electrode material is made to come in contact with the electrically-conductive adhesive material disposed on the second region on the surface of the first substrate.

Optionally, the electrically-conductive adhesive material disposed on the second region is ablated in a manner similar to the ablation of the formed second layer of the second electrode material, so that a remaining portion of the electrically-conductive adhesive material (that is left unablated after ablation) conforms to a shape of the second electrode. This allows to make precise electrical connections between segments of the electrically-conductive adhesive material left in the remaining portion and the second electrode.

Cutting the optical device also through the second region exposes the electrically-conductive adhesive material, thereby enabling integration of the second electrode with other components or devices. The step of cutting is performed as described earlier.

When the electrically-conductive adhesive material in the remaining portion of the second region is electrically connected with the driving circuit of the optical device, a conductive pathway is created between the second electrode and the driving circuit, thereby allowing a flow of electrical signals (i.e., voltage or current) between them. Hence, the driving circuit is able to control the operation of the optical device by sending signals through the conductive pathways to the second electrode.

Optionally, the driving circuit is implemented as a flexible printed circuit. Herein, the term "flexible printed circuit" refers to a type of electronic circuit that is made using flexible, thin and lightweight materials. A material for construction of the flexible printed circuit is selected in such a manner, so that the flexible printed circuit is able to withstand bending and folding. One examples of such a material is polyimide. Advantageously, the flexible printed circuit is modular and lightweight. Furthermore, a number of interconnects required to make the electrical connections are reduced, thereby improving reliability and reducing a risk of failure.

Optionally, the electrically-conductive adhesive material is electrically connected with the driving circuit using an anisotropic conductive film. Herein, the anisotropic conductive film is a thin, flexible film which emulates an adhesive interconnect system. The anisotropic conductive film is used to make electrical and mechanical connections from the electrically-conductive adhesive material to the flexible printed circuit. The anisotropic conductive film comprises conductive particles embedded in a polymer matrix. The conductive particles could be made of a metal-coated polymer material. The conductive particles could be arranged in a specific pattern that allows for electrical conductivity in one direction only. In this regard, the anisotropic conductive film could be conductive in one direction (i.e., towards the flexible printed circuit) and insulating in remaining directions.

Optionally, the anisotropic conductive film is in a form of a roll or a sheet, which can be easily cut to size and shape. The anisotropic conductive film is placed between the electrically-conductive adhesive material and the flexible printed circuit to be electrically connected, and a pressure is applied to bond the electrically-conductive adhesive material and the flexible printed circuit together. As a result of applying the pressure, the conductive particles in the anisotropic conductive film are compressed together, thereby making contact with both the electrically-conductive adhesive material and the flexible printed circuit. This creates a conductive pathway between them. The technical benefits of electrically connecting the electrically-conductive adhesive material with the driving circuit using an anisotropic conductive film is that risks related to electrical shorts are reduced, and variations in component height and spacing are well tolerated. Moreover, making the electrical connections can be automated with ease, thereby reducing an overall manufacturing cost of the optical device.

Furthermore, optionally, the optical device is any of: a liquid crystal cell, a liquid crystal lens, a liquid crystal display panel, a liquid crystal on silicon (LCOS) display panel, an organic light-emitting diode display panel, an electrophoretic display panel, an electro-wetting lens, an index-matching lens, a tunable optical filter.

Optionally, when the optical device is any of: the liquid crystal cell, the liquid crystal lens, the liquid crystal display panel, the liquid crystal on silicon (LCOS) display panel, a tunable optical filter, the at least one active material comprises a liquid crystal material. In such a case, when controlling the at least one active material, an alignment of liquid crystal molecules of the liquid crystal material is controlled to adjust at least one optical property (for example, such as a refractive index, a transparency, a polarization, or similar) of the liquid crystal material in the optical device.

Optionally, when the optical device is a liquid crystal lens, a given electrode (namely, the first electrode and/or the second electrode) is driven at a given voltage that corresponds to a given optical power that is to be produced. In such a case, in order to produce the given optical power, the refractive index of the liquid crystal material is controlled by generating a potential difference between first electrode and the second electrode using the driving circuit. This allows for varying a shape of the liquid crystal lens, based on a focal length to be produced. Moreover, a transparency of at least a part of the liquid crystal lens could be controlled by controlling a density of the liquid crystal material.

In some implementations of the liquid crystal lens, when a zero potential difference is generated (namely, by applying a same voltage to both the aforesaid electrodes or by connecting both the aforesaid electrodes to an electrical ground), the optical device is in an 'OFF' mode in which the optical device has a predefined optical power (in other words, a base optical power), which may be a negative optical power, a zero optical power, or a positive optical power, depending on user's requirement. In other implementations of the liquid crystal lens, the optical device is in an 'ON' mode in which the given optical power is produced, when a given potential difference is generated between the first electrode and the second electrode depending on the given optical power that is to be produced. In this regard, the first electrode and the second electrode can be supplied with varying voltages to allow different amounts of the potential difference to be generated therebetween. It will be appreciated that when the first electrode is driven at the given voltage, the second electrode may be connected to an electrical ground.

It will be appreciated that in a case where the at least one active material comprises a liquid crystal material, manufacturing of the optical device would be easy and economical, as certain processes for existing liquid-crystal display (LCD) manufacturing could be employed for manufacturing the optical device.

Optionally, when the optical device is a liquid crystal cell, the voltage of the first electrode and the second electrode is varied to control a transparency of (namely, an amount of light passing through) the liquid crystal cell. This allows the liquid crystal cell to function as a variable optical attenuator, a polarization rotator, or similar.

Optionally, when the optical device is a liquid crystal display panel, the voltage of the first electrode and the second electrode is varied to control a polarization of the visible light passing through the liquid crystal display panel. This results into a formation of an image comprising a combination of a plurality of pixels, each pixel displaying a corresponding colour at a corresponding brightness.

Optionally, when the optical device is an LCOS display panel, one of the first substrate and the second substrate is implemented as a silicon substrate having a reflective layer. The third layer of the at least one active material (namely, the liquid crystal material) controls the polarization of light that passes through it, while the reflective layer reflects the light back. The silicon substrate is used to control individual pixels. In this regard, the voltage of the first electrode and the second electrode is controlled to control the at least one active material.

Optionally, when the optical device is an organic light-emitting diode display panel, the third layer of the at least one active material comprises at least one of: an organic layer, a conducting layer, an emissive layer. Herein, the organic layer is composed of organic molecules or polymers. The conducting layer could be composed of organic plastic molecules that transport holes from an anode (out of the first electrode and the second electrode). Examples of such an organic plastic molecules include, but are not limited to, polyaniline and polyethylenedioxythiophene. The emissive layer could be made of another organic plastic molecules that transport electrons from a cathode (out of the first electrode and the second electrode). An example of the another organic plastic molecule is polyfluorene. In operation, the organic light-emitting diode display panel creates and subsequently emits light at the emissive layer.

Optionally, when the optical device is an electrophoretic display panel, microcapsules are deposited on top of at least one of: the first substrate, the second substrate, wherein the microcapsules comprise charged pigment particles. In this regard, a voltage is applied to the first electrode and the second electrode to move the charged pigment particles, thereby creating a visible image.

Optionally, when the optical device is an electro-wetting lens, the at least one active material comprises an electrically-conducting liquid and an electrically-insulating liquid. In such a case, a curvature of a meniscus between the electrically-conducting liquid and the electrically-insulating liquid can be controlled with a change in a potential difference generated between the first electrode and the second electrode. Thus, a given optical power can be produced based on an amount of the potential difference that is generated between the first electrode and the second electrode.

Optionally, when the optical device is an index-matching lens, a refractive index of the at least one active material could be controlled to match a refractive index of at least one of: the first substrate, the second substrate. As a result, the optical device produces a base optical power, which may be a negative optical power, a zero optical power, or a positive optical power. The refractive index of the at least one active material could also be controlled to be different from the refractive index of the at least one of: the first substrate, the second substrate, thereby creating a relative refractive index. Such a relative refractive index allows to produce a given optical power at the index-matching lens.

Optionally, when the optical device is a tunable optical filter, the at least one active material is controlled by adjusting the voltage of the first electrode and the second electrode, to transmit a predefined wavelength of light.

The present disclosure also relates to the method of the second aspect as described above. Various embodiments and variants disclosed above, with respect to the first aspect, apply mutatis mutandis to the second aspect.

Beneficially, the plurality of optical devices are stacked together in such a manner that a structural integrity of the assembly is maintained. Optionally, in this regard, adjacent optical devices from amongst the plurality of optical devices are bonded together using an optically-clear adhesive. Herein, the optically-clear adhesive enables passage of light through the respective first substrates and the respective second substrates.

Pursuant to embodiments of the present disclosure, cutting the plurality of optical devices through their remaining portions of the respective first regions on the first substrates of the plurality of optical devices allows to expose the electrically-conductive adhesive material that was previously disposed and left unablated (after ablation) on the first substrates. This allows for electrically integrating the plurality of optical devices with other electrical components or devices.

When the plurality of optical devices are stacked together, their respective first regions are aligned together. This allows for drawing electrical connections from the electrically-conductive adhesive material (left unablated after ablation) on the first regions of the plurality of optical devices in one go.

Optionally, the method further comprises electrically connecting the electrically-conductive adhesive material in remaining portions of respective regions of respective first layers corresponding to the respective first regions with a driving circuit, to provide an electrical connection between respective first electrodes and the driving circuit. In this regard, I driving circuit is responsible for controlling various aspects of the operation of the plurality of optical devices. Herein, the various aspects of the operation can be controlled by controlling voltages applied to the respective first electrodes and the respective second electrodes. In this regard, the respective first electrodes and the respective second electrodes can be supplied with varying voltages to allow different amounts of the potential difference to be generated therebetween. It will be appreciated that when the respective first electrodes are driven at their respective voltages, the respective second electrodes may be connected to an electrical ground.

Optionally, the electrically-conductive adhesive material is also disposed on respective second regions on the first substrates and is left in remaining portions of the respective second regions after ablating, wherein the respective second regions on the first substrates are free from the first electrode material, wherein the first substrates are aligned with respective second substrates to make contact between respective second electrodes and the electrically-conductive adhesive material in remaining portions of the respective second regions, wherein the respective second regions are also aligned together, further wherein the plurality of optical devices are also cut through the respective second regions during the step of cutting, the method further comprising electrical connecting the electrically-conductive adhesive material in the remaining portions of the respective second regions with the driving circuit, to provide an electrical connection between respective second electrodes and the driving circuit.

When the plurality of optical devices are stacked together, the remaining portions of the respective first regions and the remaining portions of the second regions are aligned together. This allows for drawing electrical connections from the electrically-conductive adhesive material (left after ablation) on the first regions and the second regions of the plurality of optical devices in one go.

Cutting the plurality of optical devices through the remaining portions of the respective second regions on the first substrates of the plurality of optical devices allows to expose the electrically-conductive adhesive material that was previously disposed on the respective second regions and left after ablation on the first substrates. This allows for electrically integrating the plurality of optical devices with other electrical components or devices.

Various aspects of the operation of the plurality of optical devices can be controlled by controlling voltages applied to the respective first electrodes and the respective second electrodes. Herein, the respective first electrodes and the respective second electrodes can be supplied with varying voltages to allow different amounts of the potential difference to be generated therebetween.

Optionally, the driving circuit is implemented as a flexible printed circuit.

Optionally, the electrically-conductive adhesive material is electrically connected with the driving circuit using an anisotropic conductive film.

Electrical connections are drawn from the respective first electrodes and the respective second electrodes of the plurality of optical devices in a simple and efficient manner. Moreover, a first side where the first regions are aligned together could be different from a second side where the second regions are aligned together. A technical benefit of this feature is that an electrical short is effectively prevented, as the electrical connections to the respective first regions are drawn from the first side, while the electrical connections to the respective second regions are drawn from the second side.

Optionally, when stacked together, the plurality of optical devices form any of: a composite liquid crystal lens, a volumetric liquid crystal display, a volumetric liquid crystal on silicon (LCOS) display, a volumetric organic light-emitting diode display, a volumetric electrophoretic display, a composite electro-wetting lens, a composite index-matching lens, a composite tunable optical filter. When the plurality of optical devices form the composite liquid crystal lens, it means that multiple liquid crystal lenses are stacked together. When the plurality of optical devices form the volumetric liquid crystal display, it means that multiple liquid crystal display panels are stacked together. When the plurality of optical devices form the volumetric liquid crystal on silicon (LCOS) display, it means that multiple liquid crystal on silicon (LCOS) display panels are stacked together. When the plurality of optical devices form the volumetric organic light-emitting diode display, it means that multiple organic light-emitting diode display panels are stacked together. When the plurality of optical devices form the volumetric electrophoretic display, it means that multiple electrophoretic display panels are stacked together. When the plurality of optical devices form the composite electro-wetting lens, it means that multiple electro-wetting lenses are stacked together. When the plurality of optical devices form the composite index-matching lens, it means that multiple index-matching lenses are stacked together. When the plurality of optical devices form the composite tunable optical filter, it means that multiple tunable optical filters are stacked together.

Optionally, when the plurality of optical devices form a composite liquid crystal lens, the liquid crystal material in the plurality of optical devices (that are stacked together) is controlled separately to produce respective optical powers, wherein the respective optical powers produced at the plurality of optical devices are combined to produce an overall optical power. A technical benefit of stacking together a plurality of liquid crystal lenses (namely, the plurality of optical devices) is that a high optical power can be produced, based on a user's requirement.

Optionally, the step of disposing the electrically-conductive adhesive material is performed using an electrically-conductive adhesive tape. The term "electrically-conductive adhesive tape" refers to a flexible tape that has adhesive properties as well as electrical conductivity properties. In this regard, the electrically-conductive adhesive tape comprises a base material with conductive particles embedded in the base material. Optionally, the base material comprises an adhesive material applied on a side opposite to a side where the conductive particles are embedded. Herein, the base material can be at least one of: a plastic film, a polymer film, which provides adhesive properties. The conductive material can be at least one of: metal flakes, metal fibres. Optionally, the adhesive material allows the electrically-conductive adhesive tape to adhere to the first region and optionally, the second region, of the surface of the first substrate. Examples of the electrically-conductive adhesive material may include, but are not limited to, an electrically-conductive silicon tape, an electrically-conductive adhesive transfer tape, and an electrically-conductive aluminium foil tape.

The present disclosure also relates to the method of the third aspect as described above. Various embodiments and variants disclosed above, with respect to the first aspect, apply mutatis mutandis to the third aspect.

Throughout the present disclosure, the term "welding" refers to a process of using at least one of: heat, pressure to form a layer of an electrode material onto a surface of a substrate. This welding can be performed using welding techniques that are well-known in the art. Examples of such welding techniques may include, but are not limited to, laser welding, hot air welding technique, infrared welding technique, friction welding technique, ultrasound welding, cold welding technique, hot gas welding technique, and electro-fusion welding technique. Herein, the first layer can be formed as a thick layer on the surface of the first substrate. A technical effect of forming the thick layer on the surface of the first substrate is that electrical connection can be drawn directly from the first electrode (after the step of ablation) without a requirement of auxiliary materials (such as an electrically-conductive adhesive material).

The second electrode material may be same as or different from the first electrode material. Optionally, the second layer of the second electrode material is formed on the surface of the second substrate of the optical device, using welding. The welding techniques used for forming the second layer of the second electrode material on the second substrate can be same as or different from the welding techniques used for forming the first layer of the first electrode material on the first substrate. The second layer can be formed as a thick layer on the surface of the second substrate, wherein a thickness of the layer of the second electrode material formed on the second substrate may be same as or different from a thickness of the layer of the first electrode material formed on the first substrate.

Optionally, the method further comprises:
cutting the optical device through a first region on the first substrate, wherein the first layer of the first electrode material extends to the first region; and
electrically connecting the first electrode with a driving circuit of the optical device at the first region.

Optionally, the driving circuit is implemented as a flexible printed circuit.

Optionally, the first electrode is electrically connected with the driving circuit using an anisotropic conductive film.

Optionally, the first electrode material is in a form of a metal foil, and wherein the step of forming the first layer of the first electrode material is performed by laser-welding the metal foil on the surface of the first substrate. Herein, the term "metal foil" refers to a sheet of metal formed by hammering and/or rolling the metal. Said sheet of metal is used for forming the first electrode material. The term "laser-welding" refers to a process of using concentrated heat from a heat source, wherein said concentrated heat is generated using a laser, to melt the metal foil and fuse with the surface of the first substrate upon cooling. The laser-welding can be performed using laser-welding techniques well-known in the art. Examples of such laser-welding technique may include, but are not limited to, conduction laser-welding technique, hybrid laser-welding technique, and pulsed laser-welding technique. A technical effect of using laser-welding is that the first layer of the first electrode material can be formed precisely, accurately, with a low risk of thermal distortion (thereby reducing a risk of damaging the first electrode material and the first substrate) on the surface of the first substrate.

Optionally, the second electrode material is in a form of a metal foil, and wherein the step of forming the second layer of the second electrode material is performed by laser-welding the metal foil on the surface of the second substrate. Herein, the metal foil used for forming the second electrode material could be same as or different from the metal foil used for forming the first electrode material. The laser-welding technique used for forming the second layer could be same as or different from the laser-welding technique used for forming the first layer.

Optionally, the optical device is any of: a liquid crystal cell, a liquid crystal lens, a liquid crystal display panel, a liquid crystal on silicon (LCOS) display panel, an organic light-emitting diode display panel, an electrophoretic display panel, an electro-wetting lens, an index-matching lens, a tunable optical filter.

DETAILED DESCRIPTION OF THE DRAWINGS

Figure 2:
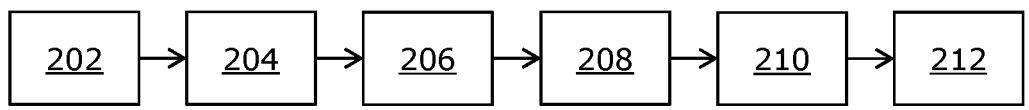
FIG. 2 illustrates steps of a method for manufacturing an optical device, in accordance with an embodiment of the present disclosure.

Referring to FIG. 2, illustrated are steps of a method for manufacturing an optical device, in accordance with an embodiment of the present disclosure. At step 202, a first layer of a first electrode material is formed on a surface of a first substrate of the optical device. At step 204, an electrically-conductive adhesive material is disposed on at least a region of the first layer corresponding to a first region of the surface of the first substrate. At step 206, the disposed electrically-conductive adhesive material is ablated from at least one portion of the first region, whilst the formed first layer of the first electrode material is ablated to create a first electrode. At step 208, a second layer of a second electrode material is formed on a surface of a second substrate of the optical device. At step 210, the formed second layer of the second electrode material is ablated to create a second electrode. At step 212, a third layer of at least one active material is formed between the first substrate and the second substrate, wherein the first electrode is disposed between the first substrate and said third layer of the at least one active material, and the second electrode is disposed between the second substrate and said third layer of the at least one active material.

The aforementioned steps are only illustrative and other alternatives can also be provided where one or more steps are added, one or more steps are removed, or one or more steps are provided in a different sequence without departing from the scope of the claims herein.

Figure 3A:
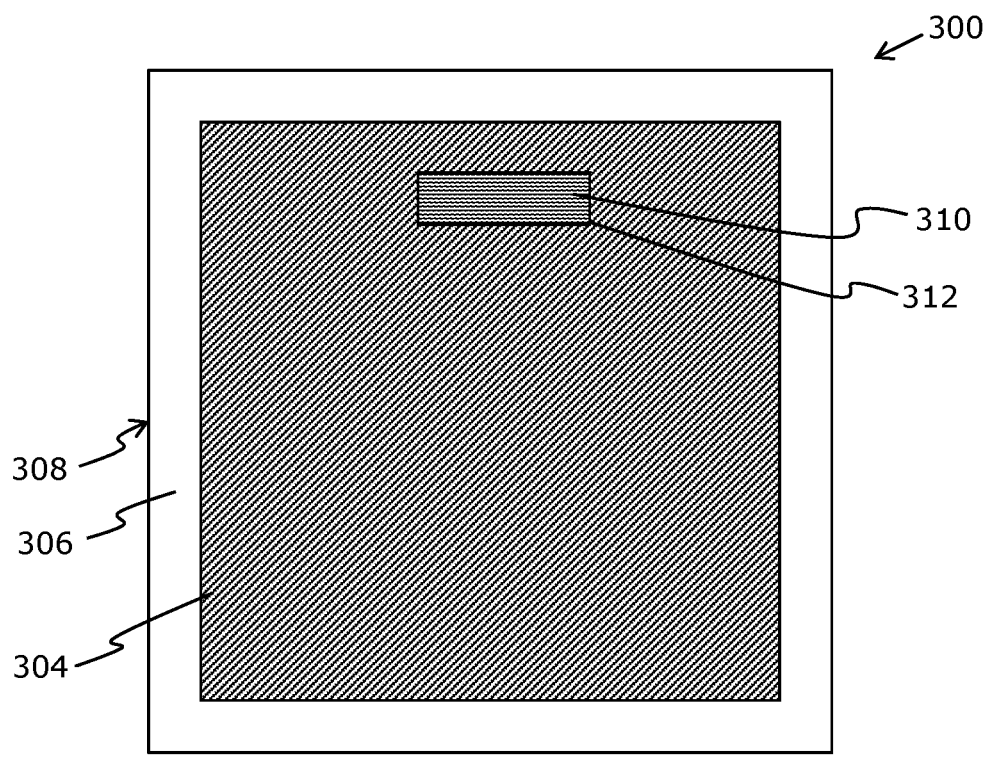
FIGS. 3A, 3B, and 3C collectively show schematic representations of formation of a first electrode of an optical device, in accordance with an embodiment of the present disclosure.
Figure 3B:
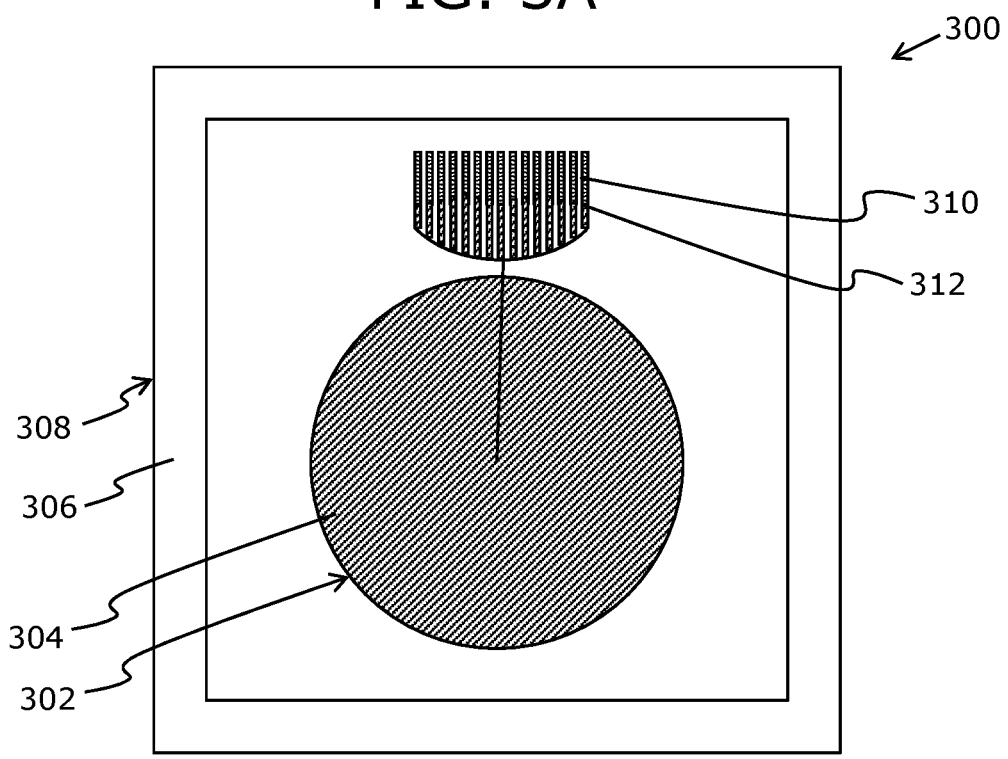
Figure 3C:
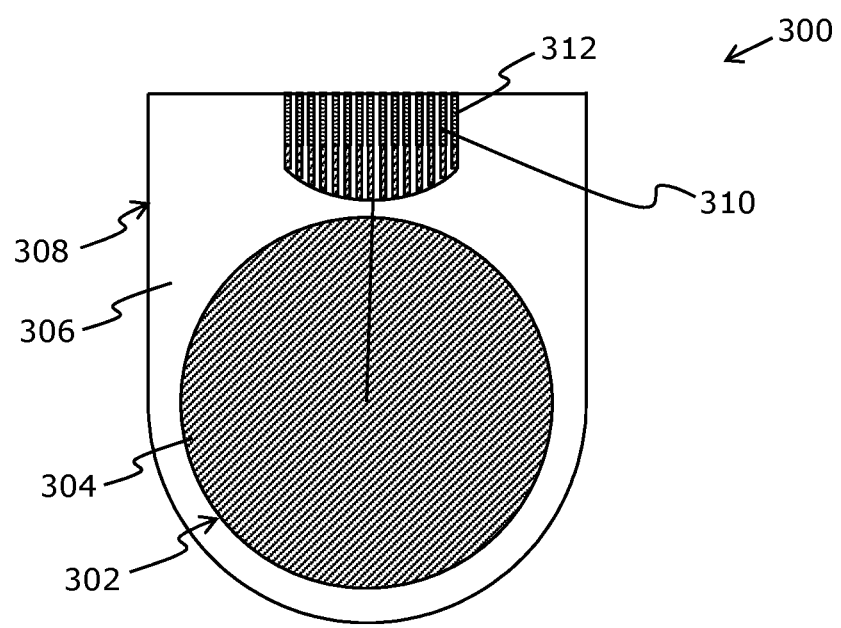

Referring to FIGS. 3A, 3B, and 3C collectively, there are shown schematic representations of formation of a first electrode 302 of an optical device 300, in accordance with an embodiment of the present disclosure. In FIGS. 3A-C, a first layer 304 of a first electrode material is formed on a surface 306 of a first substrate 308 of the optical device 300. An electrically-conductive adhesive material 310 is disposed on at least a region of the first layer 304 corresponding to a first region 312 of the surface 306 of the first substrate 308.

In FIG. 3B, the electrically-conductive adhesive material 310 is ablated from at least one portion of the first region 312, which produces separate, unconnected segments of the electrically-conductive adhesive material 310 on the first region 312 of the surface 306. Simultaneously, the first layer 304 of the first electrode material is ablated corresponding to the at least one portion of the first region 312 in a manner similar to the ablation of the electrically-conductive adhesive material 310 from the at least one portion of the first region 312, to create the first electrode 302. With reference to FIG. 3B, a remaining portion of the first layer 304 of the first electrode material is also ablated in a circular shape, whilst forming a connecting part (depicted as a line) between the circular shape and the unablated portion of the first layer 304 of the first electrode material. In FIG. 3C, the optical device 300 is cut through the first region 312 on the first substrate 308.

Figure 3D:
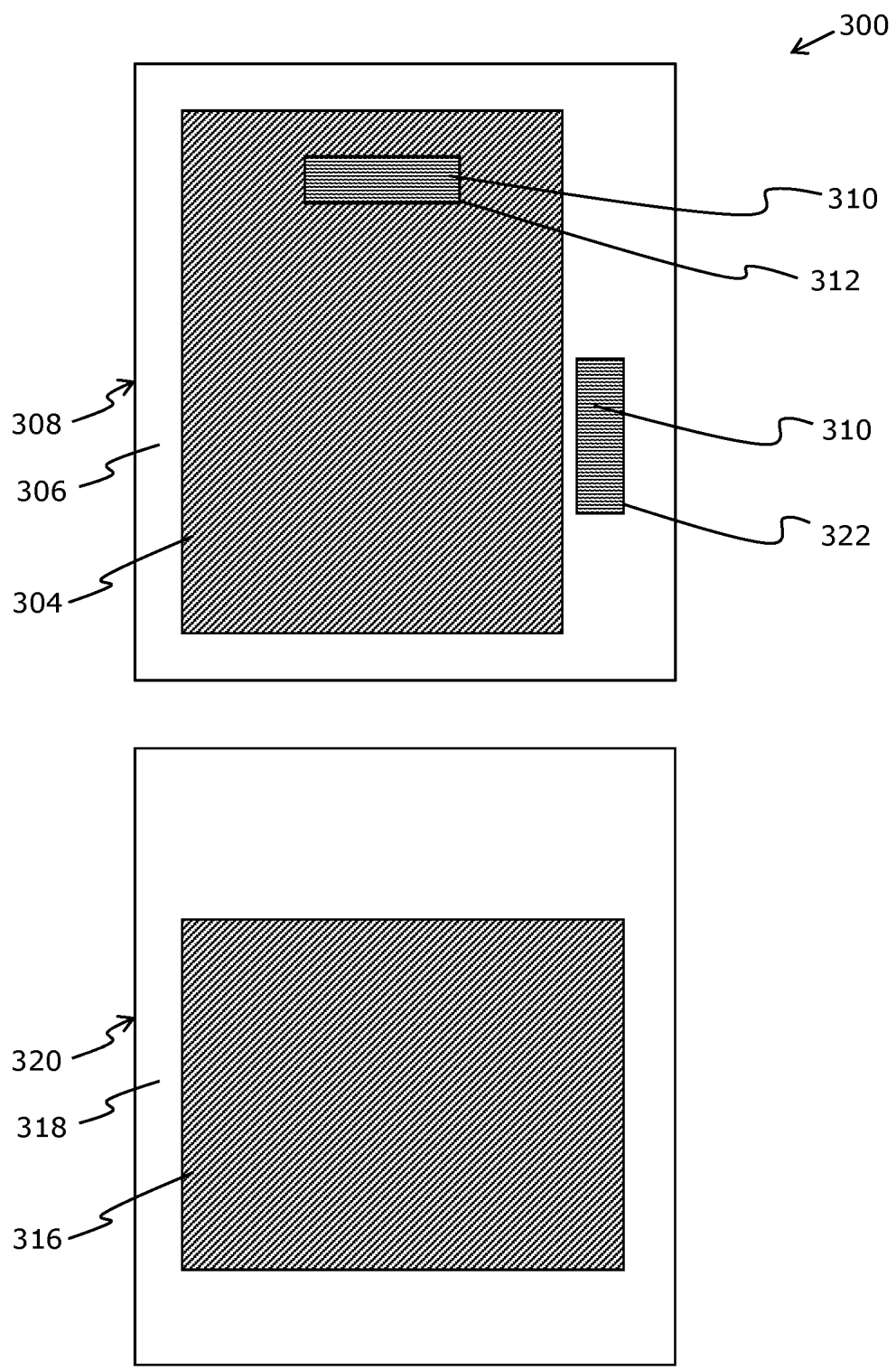
FIGS. 3D, 3E and 3F collectively show schematic representations of formation of a second electrode of an optical device, in accordance with an embodiment of the present disclosure.
Figure 3E:
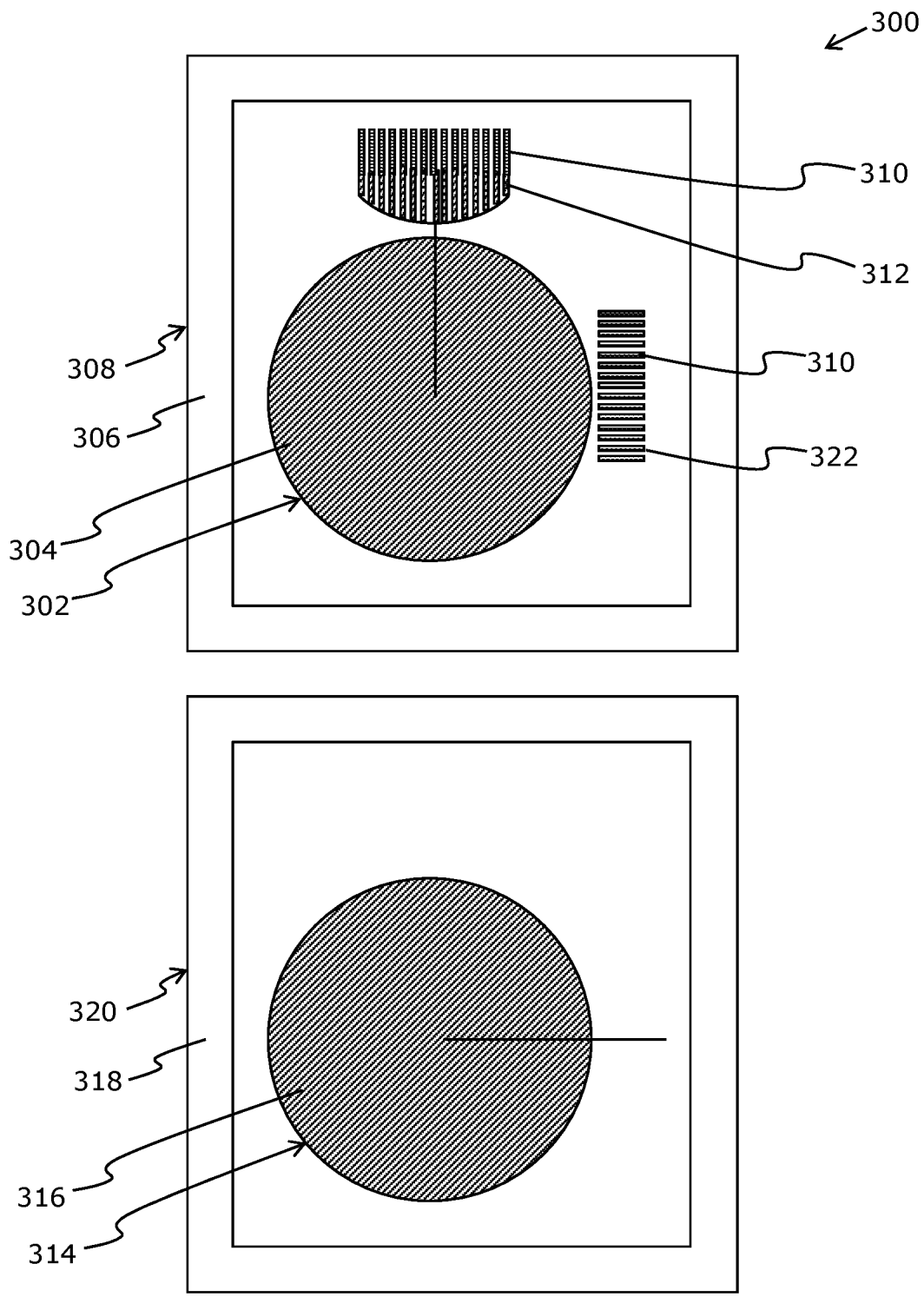
Figure 3F:
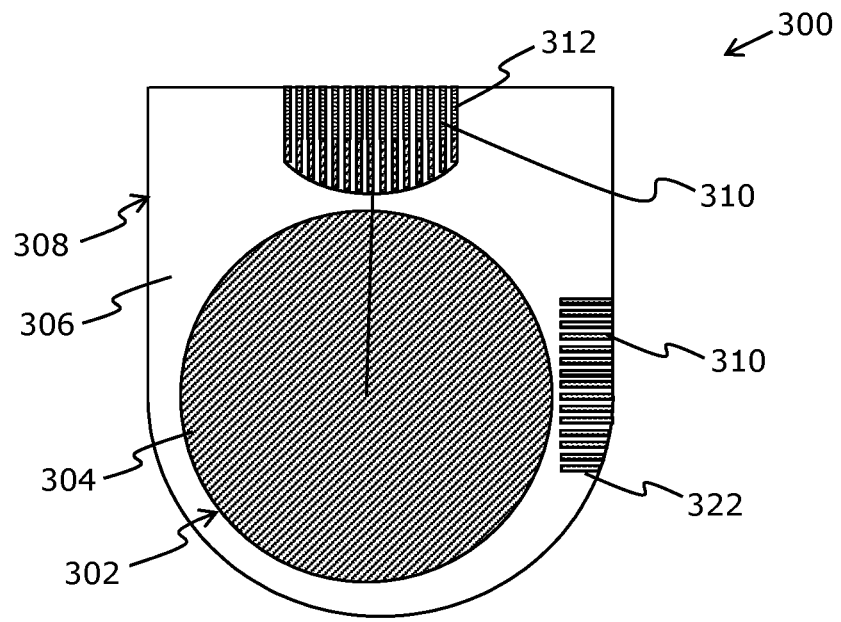
Figure 3F:
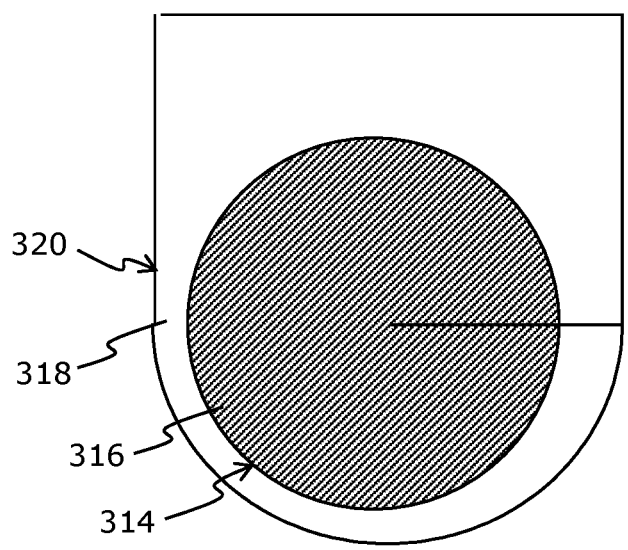

Referring to FIGS. 3D, 3E, and 3F collectively, there are shown schematic representations of a manufacturing process of formation of a second electrode 314 of the optical device 300, in accordance with an embodiment of the present disclosure. In FIGS. 3D-F, a second layer 316 of a second electrode material is formed on a surface 318 of a second substrate 320 of the optical device 300. The electrically-conductive adhesive material 310 is also disposed on a second region 322 of the surface 306 of the first substrate 308, wherein the second region 322 of the surface 306 of the first substrate 308 is free from the first electrode material.

In FIG. 3E, the electrically-conductive adhesive material 310 is also ablated from at least one portion of the second region 322 when the electrically-conductive adhesive material 310 and the first layer 304 of the first electrode material are ablated corresponding to the at least one portion of the first region 312, to create the first electrode 302. Moreover, the second layer 316 of the second electrode material is ablated to create the second electrode 314. Herein, the second layer 316 of the second electrode material is formed on the surface 318 of the second substrate 320 in such a manner that when the first substrate 308 and the second substrate 320 are aligned together, the second electrode 314 makes contact with the electrically-conductive adhesive material 310 in a remaining portion of the second region 322. In FIG. 3F, the optical device 300 is also cut through the second region 322 on the first substrate 308.

FIGS. 3A-F are merely examples, which should not unduly limit the scope of the claims herein. The person skilled in the art will recognize many variations, alternatives, and modifications of embodiments of the present disclosure.

Figure 4A:
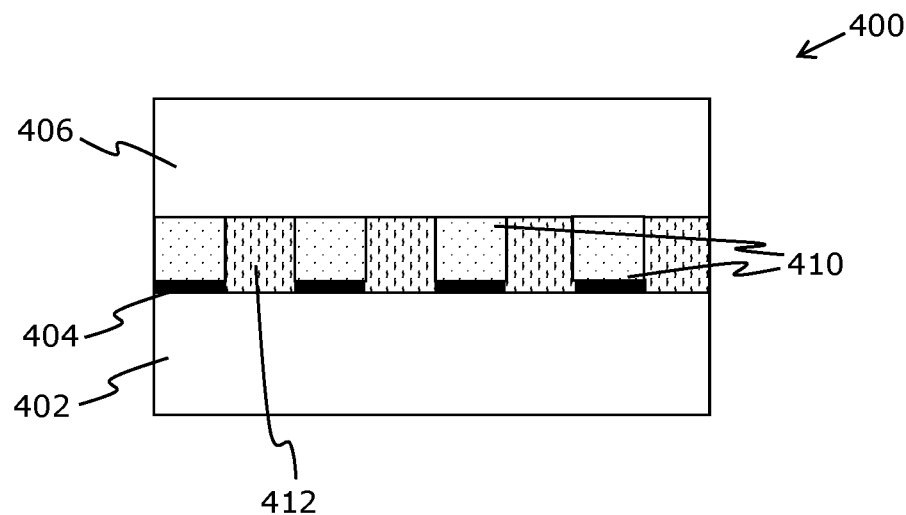
Figure 4B:
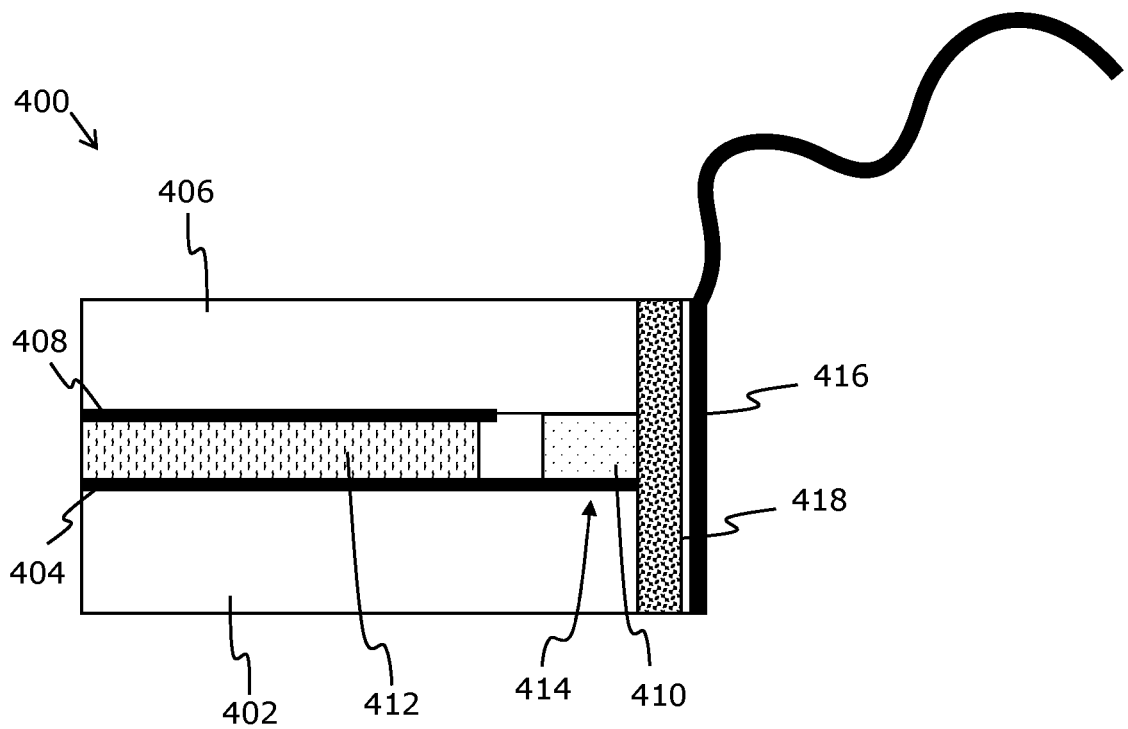
FIG. 4B illustrates a side cross-section view of the optical device, in accordance with an embodiment of the present disclosure.

Referring to FIG. 4A, illustrated is a front cross-section view of an optical device 400, whereas in FIG. 4B, illustrated is a side cross-section view of the optical device 400, in accordance with an embodiment of the present disclosure. In FIGS. 4A and 4B, the optical device 400 comprises a first substrate 402, a first electrode 404 (formed after ablation of a first layer of a first electrode material from the first substrate 402), a second substrate 406, a second electrode 408 (formed after ablation of a second layer of a second electrode material from the second substrate 406), an electrically-conductive adhesive material 410 (that is left unablated after ablation on a first region 414 of the first substrate 402), and at least one active material (as depicted by an active material 412).

FIGS. 4A and 4B depict only one side of the optical device 400, and therefore, show the electrically-conductive adhesive material 410 that is left unablated after ablation on the first region 414 of the first substrate 402, for the sake of simplicity. In FIG. 4B, the side cross-section view depicts that when the optical device 400 is cut through the first region 414 of the first substrate 402, the electrically-conductive adhesive material 410 is exposed, thereby allowing for drawing electrical connections therefrom. As shown, the electrically-conductive adhesive material 410 is electrically connected with a driving circuit 416 of the optical device 400, to provide an electrical connection between the first electrode 404 and the driving circuit 416. The electrically-conductive adhesive material 410 is electrically connected with the driving circuit 416 using an anisotropic conductive film 418.

FIGS. 4A and 4B, are merely examples, which should not unduly limit the scope of the claims herein. The person skilled in the art will recognize many variations, alternatives, and modifications of embodiments of the present disclosure.

Figure 5:
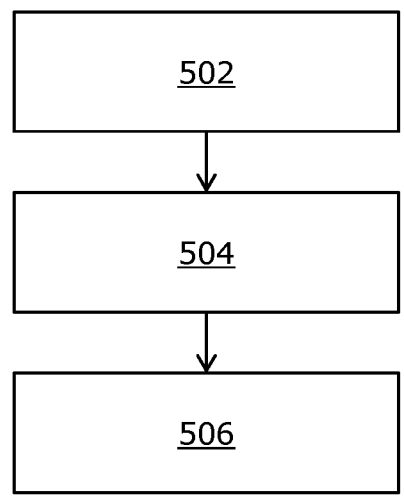
FIG. 5. illustrates steps of a method for assembling a plurality of optical devices, in accordance with an embodiment of the present disclosure.

Referring to FIG. 5, illustrated are steps of a method for assembling a plurality of optical devices, in accordance with an embodiment of the present disclosure. At step 502, a plurality of optical devices are manufactured, wherein each of the plurality of optical devices is manufactured according to the method illustrated in FIG. 2. At step 504, the plurality of optical devices are cut through respective first regions on first substrates of the plurality of optical devices. At step 506, the plurality of optical devices are stacked together, whilst the respective first regions are aligned together.

The aforementioned steps are only illustrative and other alternatives can also be provided where one or more steps are added, one or more steps are removed, or one or more steps are provided in a different sequence without departing from the scope of the claims herein.

Figure 6:
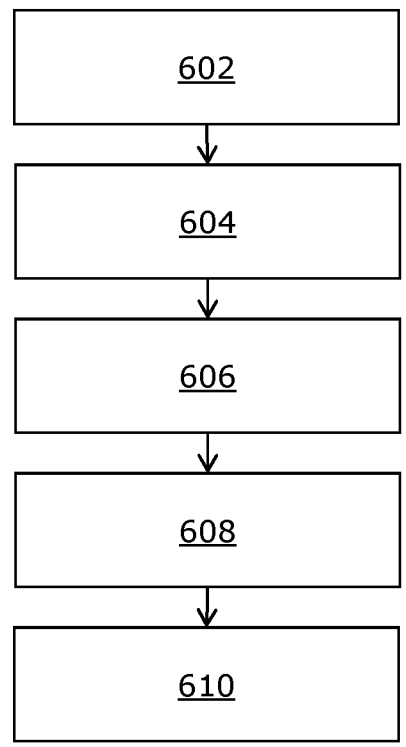
FIG. 6 illustrates steps of a method for manufacturing an optical device, in accordance with another embodiment of the present disclosure.

Referring to FIG. 6, illustrated are steps of a method for manufacturing an optical device, in accordance with another embodiment of the present disclosure. At step 602, a first layer of a first electrode material is formed on a surface of a first substrate of the optical device, using welding. At step 604, the formed first layer of the first electrode material is ablated to create a first electrode. At step 606, a second layer of a second electrode material is formed on a surface of a second substrate of the optical device. At step 608, the formed second layer of the second electrode material is ablated to create a second electrode. At step 610, a third layer of at least one active material is formed between the first substrate and the second substrate, wherein the first electrode is disposed between the first substrate and said third layer of the at least one active material, and the second electrode is disposed between the second substrate and said third layer of the at least one active material.

The aforementioned steps are only illustrative and other alternatives can also be provided where one or more steps are added, one or more steps are removed, or one or more steps are provided in a different sequence without departing from the scope of the claims herein.

The invention claimed is:

1. A method for manufacturing an optical device, the method comprising:
   forming a first layer of a first electrode material on a surface of a first substrate of the optical device;
   disposing an electrically-conductive adhesive material on at least a region of the first layer corresponding to a first region of the surface of the first substrate;
   ablating the disposed electrically-conductive adhesive material and the first electrode material on which the electrically-conductive adhesive material is disposed from at least one portion of the first region;
   simultaneously ablating a remaining portion of the formed first layer of the first electrode material, separate from the first region, to create a first electrode;
   forming a second layer of a second electrode material on a surface of a second substrate of the optical device;
   ablating the formed second layer of the second electrode material to create a second electrode; and
   forming a third layer of at least one active material between the first substrate and the second substrate, wherein the first electrode is disposed between the first substrate and said third layer of the at least one active material, and the second electrode is disposed between the second substrate and said third layer of the at least one active material.

2. The method of claim 1, further comprising:
   cutting the optical device through the first region on the first substrate; and
   electrically connecting the electrically-conductive adhesive material in a remaining portion of the region of the first layer corresponding to the first region with a driving circuit of the optical device, to provide an electrical connection between the first electrode and the driving circuit.

3. The method of claim 2, wherein the electrically-conductive adhesive material is also disposed on a second region of the surface of the first substrate during the step of disposing, wherein the second region of the surface of the first substrate is free from the first electrode material,
   wherein the disposed electrically-conductive adhesive material is also ablated from at least one portion of the second region during the step of ablating, the method further comprising:
aligning the first substrate and the second substrate together, prior to or during the step of forming the third layer of at least one active material, to make contact between the second electrode and the electrically-conductive adhesive material in a remaining portion of the second region, wherein the optical device is also cut through the second region during the step of cutting; and
electrically connecting the electrically-conductive adhesive material in the remaining portion of the second region with the driving circuit of the optical device, to provide an electrical connection between the second electrode and the driving circuit.

4. The method of claim 2, wherein the driving circuit is implemented as a flexible printed circuit.

5. The method of claim 2, wherein the electrically-conductive adhesive material is electrically connected with the driving circuit using an anisotropic conductive film.

6. The method of claim 1, wherein the optical device is any of: a liquid crystal cell, a liquid crystal lens, a liquid crystal display panel, a liquid crystal on silicon (LCOS) display panel, an organic light-emitting diode display panel, an electrophoretic display panel, an electro-wetting lens, an index-matching lens, a tunable optical filter.

7. A method for assembling a plurality of optical devices, the method comprising:
manufacturing a plurality of optical devices, wherein each of the plurality of optical devices is manufactured using a method of claim 1;
cutting the plurality of optical devices through respective first regions on first substrates of the plurality of optical devices; and
stacking the plurality of optical devices together, whilst aligning the respective first regions together.

8. The method of claim 7, further comprising electrically connecting an electrically-conductive adhesive material in remaining portions of respective regions of respective first layers corresponding to the respective first regions with a driving circuit, to provide an electrical connection between respective first electrodes and the driving circuit.

9. The method of claim 8, wherein the electrically-conductive adhesive material is also disposed on respective second regions on the first substrates and is left in remaining portions of the respective second regions after ablating, wherein the respective second regions on the first substrates are free from the first electrode material,
wherein the first substrates are aligned with respective second substrates to make contact between respective second electrodes and the electrically-conductive adhesive material in remaining portions of the respective second regions, wherein the respective second regions are also aligned together, further wherein the plurality of optical devices are also cut through the respective second regions during the step of cutting,
the method further comprising electrical connecting the electrically-conductive adhesive material in the remaining portions of the respective second regions with the driving circuit, to provide an electrical connection between respective second electrodes and the driving circuit.

10. The method of claim 8, wherein the driving circuit is implemented as a flexible printed circuit.

11. The method of claim 8, wherein the electrically-conductive adhesive material is electrically connected with the driving circuit using an anisotropic conductive film.

12. The method of claim 7, wherein when stacked together, the plurality of optical devices form any of: a composite liquid crystal lens, a volumetric liquid crystal display, a volumetric liquid crystal on silicon (LCOS) display, a volumetric organic light-emitting diode display, a volumetric electrophoretic display, a composite electro-wetting lens, a composite index-matching lens, a composite tunable optical filter.

13. The method of claim 1, wherein the step of ablating is performed using laser ablation.

14. The method of claim 1, wherein the step of ablating is performed using etching.

15. The method of claim 1, wherein the step of disposing the electrically-conductive adhesive material is performed using an electrically-conductive adhesive tape.

16. A method for manufacturing an optical device, the method comprising:
forming a first layer of a first electrode material on a surface of a first substrate of the optical device, using welding;
ablating the first electrode material from at least one portion of a first region of the first layer corresponding to a first region of the surface of the first substrate;
simultaneously ablating a remaining portion of the formed first layer of the first electrode material, separate from the first region, to create a first electrode;
forming a second layer of a second electrode material on a surface of a second substrate of the optical device;
ablating the formed second layer of the second electrode material to create a second electrode; and
forming a third layer of at least one active material between the first substrate and the second substrate, wherein the first electrode is disposed between the first substrate and said third layer of the at least one active material, and the second electrode is disposed between the second substrate and said third layer of the at least one active material.

17. The method of claim 16, further comprising: pq,40
cutting the optical device through the first region on the first substrate, wherein the first layer of the first electrode material extends to the first region; and
electrically connecting the first electrode with a driving circuit of the optical device at the first region.

18. The method of claim 17, wherein the driving circuit is implemented as a flexible printed circuit.

19. The method of claim 17, wherein the first electrode is electrically connected with the driving circuit using an anisotropic conductive film.

20. The method of claim 16, wherein the first electrode material is in a form of a metal foil, and wherein the step of forming the first layer of the first electrode material is performed by laser-welding the metal foil on the surface of the first substrate.

21. The method of claim 16, wherein the second electrode material is in a form of a metal foil, and wherein the step of forming the second layer of the second electrode material is performed by laser-welding the metal foil on the surface of the second substrate.

22. The method of claim 16, wherein the optical device is any of: a liquid crystal cell, a liquid crystal lens, a liquid crystal display panel, a liquid crystal on silicon (LCOS) display panel, an organic light-emitting diode display panel, an electrophoretic display panel, an electro-wetting lens, an index-matching lens, a tunable optical filter.

* * * * *